US007245011B2

(12) United States Patent
Liu

(10) Patent No.: US 7,245,011 B2
(45) Date of Patent: Jul. 17, 2007

(54) PREVENTION OF CONTAMINATION ON BONDING PADS OF WAFER DURING SMT

(75) Inventor: Sheng-Tsung Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/968,053

(22) Filed: Oct. 20, 2004

(65) Prior Publication Data
US 2005/0082682 A1   Apr. 21, 2005

(30) Foreign Application Priority Data
Oct. 21, 2003   (TW) ............................... 92129159 A

(51) Int. Cl.
H01L 23/12   (2006.01)
(52) U.S. Cl. ...................... 257/724; 257/678; 257/734; 257/E23.001; 257/23.003; 257/E23.023
(58) Field of Classification Search ................ 257/734, 257/724
See application file for complete search history.

(56) References Cited

U.S. PATENT DOCUMENTS

| 4,336,551 | A | * | 6/1982 | Fujita et al. | 257/668 |
| 4,767,892 | A | * | 8/1988 | Kobari | 174/256 |
| 5,075,965 | A | * | 12/1991 | Carey et al. | 29/840 |
| 5,334,422 | A | * | 8/1994 | Myers et al. | 427/552 |
| 5,425,647 | A | * | 6/1995 | Mencik et al. | 439/83 |
| 5,930,889 | A | * | 8/1999 | Klein | 29/840 |
| 6,049,122 | A | * | 4/2000 | Yoneda | 257/668 |
| 6,689,636 | B2 | * | 2/2004 | Liao et al. | 438/107 |
| 6,870,248 | B1 | * | 3/2005 | Shibata | 257/686 |
| 6,927,347 | B2 | * | 8/2005 | Yamaguchi et al. | 174/260 |
| 6,933,617 | B2 | * | 8/2005 | Pierce | 257/786 |
| 7,009,114 | B2 | * | 3/2006 | Urakawa et al. | 174/250 |
| 2004/0040742 | A1 | * | 3/2004 | Ishizaki | 174/257 |

FOREIGN PATENT DOCUMENTS

TW   459354   10/2001

* cited by examiner

Primary Examiner—Minhloan Tran
Assistant Examiner—Eduardo A. Rodela
(74) Attorney, Agent, or Firm—Troxell Law Office, PLLC

(57) ABSTRACT

A semiconductor device is disclosed for preventing contamination on its bonding pads during mounting an electronic component, such as surface mount device (SMD). The semiconductor device includes a semiconductor substrate, a plurality of jointing material and at least an electronic component. A plurality of first bonding pads for wire-bonding and a plurality of second bonding pads for mounting the electronic component are formed on the active surface of the substrate. The substrate includes at least a dam is formed on the active surface to separate the first bonding pads from the second bonding pads. Preferably, the dam surrounds the second bonding pads. The jointing material is disposed on the second bonding pads for bonding the electronic component. Using the dam, there is no flux or tin-lead solder flowing onto the first bonding pads during reflowing the jointing material. In an embodiment, the electronic component can be mounted on the substrate in a wafer level.

17 Claims, 5 Drawing Sheets

PREVENTION OF CONTAMINATION ON BONDING PADS OF WAFER DURING SMT

FIELD OF THE INVENTION

The present invention generally relates to a semiconductor device connected with surface mount devices or the other electronic components, and more particularly, to the prevention of contamination on bonding pads of a wafer during SMT (surface mounting technology).

BACKGROUND OF THE INVENTION

Conventionally in SOC (System On Chip) technology, all the passive components are embedded and are integrated with the integrated circuits inside a wafer, but materials, film thicknesses and manufacturing processes of the passive components are quite different from those of the integrated circuits on a wafer, resulting in very high cost. Now the passive components with SMD (surface mount device) type are very cheap, another solution is provided that SMD type passive components are encapsulated inside semiconductor packages. A known structure of a semiconductor chip with surface mount device is disclosed in R.O.C. Taiwan Patent publication No. 459,354. A SMD is directly mounted on the active surface of the chip. Formed on the active surface of the chip are not only SMT pads but also a plurality bonding pads for outer electrical connection by wire-bonding or flip-chip bonding. Usually the electrodes of the SMD are connected using jointing material, such as tin-lead solder. When the jointing material is reflowed, the SMD can be mounted on a chip as wafer level packages. The SMD and a wafer can be manufactured respectively, and then connected both together. However, tin-lead solder or flux as the jointing material will become liquid with good mobility during reflowing process, it may contaminate the bonding pads (wire bonding pads or flip chip bonding pads) of a wafer. The residue of the jointing material on the active surface of the wafer (wafer passivation layer) can be cleaned by means of solvents. However, when the bonding pads of the wafer are contaminated, it becomes very hard to clean.

SUMMARY

The primary object of the present invention is to provide a semiconductor device for preventing contamination of bonding pads during SMT process. A substrate includes a plurality of first bonding pads, a plurality of second bonding pads and a dam. Jointing material is formed on the second bonding pads for mounting an electronic component, such as a surface mount device. The dam is formed on the active surface of the substrate to separate the first bonding pads from the second bonding pads. Preferably, the dam includes a space. The dam can block and disperse the jointing material under reflowing temperature in order to prevent contamination on the first bonding pads during SMT process.

The secondary object of the present invention is to provide a method for preventing contamination on bonding pads during SMT processes, especially in wafer-level processes. Before mounting an electronic component onto the active surface of the substrate (wafer), the substrate includes a dam formed to separate the first bonding pads from the second bonding pads. Using the dam, the jointing material on the second bonding pads can be blocked and dispersed during reflowing in order to prevent contamination on the first bonding pads during SMT process.

According to the present invention a semiconductor device for preventing contamination on bonding pads during SMT processes includes a substrate, a jointing material and at least an electronic component. The substrate has an active surface and a back surface corresponding to the active surface. Formed on the active surface of the substrate are a plurality of first bonding pads, a plurality of second bonding pads and a dam. In an embodiment, the first bonding pads may be wire-bonding pads and be formed at periphery of the active surface, the second bonding pads may be SMT pads and be formed at the central region of the active surface. The dam can include a space made of a patterned photoresist or a patterned passivation layer, preferably to surround the second bonding pads. The jointing material is formed on the second bonding pads for connecting the electrodes of the electronic component with the second bonding pads on the active surface of the substrate. Due to the dam, the jointing material cannot contaminate the first bonding pads during reflowing process.

DETAILED DESCRIPTION OF THE PRESENT INVENTION

Figure 1:
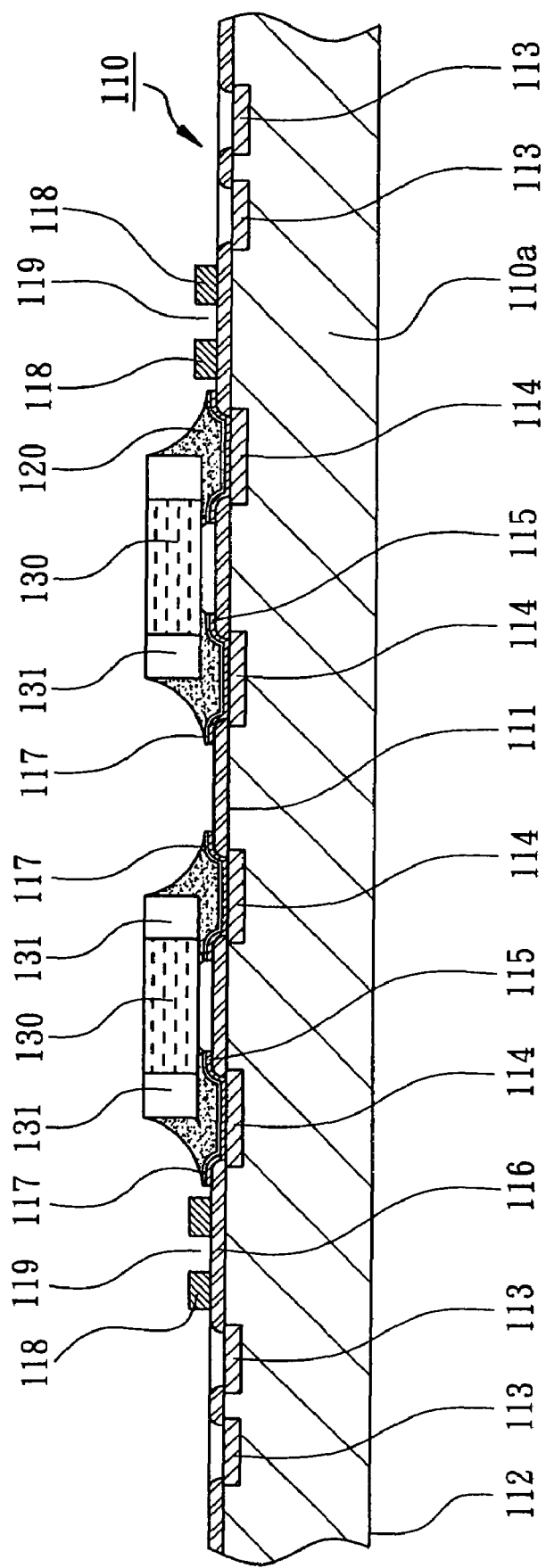
FIG. 1 is a cross-sectional view of a semiconductor device in accordance with the first embodiment of the present invention.

Referring to the drawings attached, the present invention will be described by means of the embodiments below.

Figure 2:
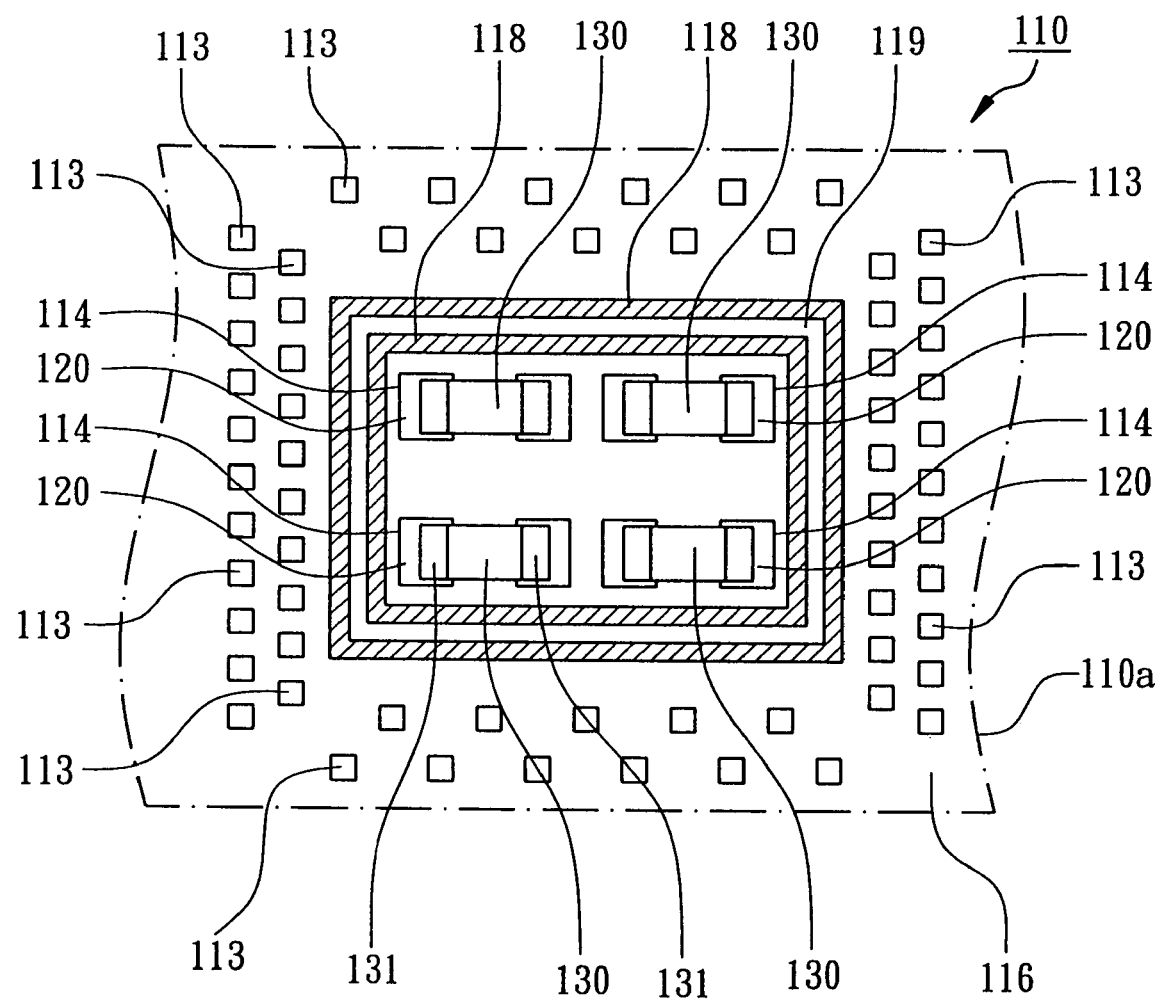
FIG. 2 is a top view of the semiconductor device in accordance with the first embodiment of the present invention.

According to the first embodiment of the present invention, a semiconductor device for preventing contamination on bonding pads during SMT process is shown in FIGS. 1, 2. The semiconductor device includes a semiconductor substrate 110, a plurality of jointing material 120 and at least an electronic component 130. The substrate 110 can be a wafer, a chip, or a wafer-level chip scale package (WLCSP). In this embodiment, the substrate 110 is a wafer including a plurality of semiconductor chips 110a, and has an active surface 111 and a back surface 112 opposing to the active surface 111. A plurality of first bonding pads 113 and a plurality of second bonding pads 114 are formed on the active surface 111. In this embodiment, a redistribution layer having a plurality of traces (not showed in the figures) is formed on the active surface 111 of the wafer 110 to connect the second bonding pads 114 to the integrated circuits (not showed in the drawings) inside the wafer or to the first bonding pads 113. In this embodiment, the first bonding pads 113 can be the wire-bonding pads formed at periphery of the active surface 111 corresponding to each chip 110a and arranged in single-row form, multi-row staggered form or the others. The second bonding pads 114 can serve as SMT pads for connecting the electronic component 130.

Preferably, an under bump metallurgy (UBM) layer 115, such as Cr—Cu, Al—Ni, or V—Cu layer, is covered over the second bonding pads 114. The UBM layer 115 can further extends to a portion of a wafer passivation layer 116 of the wafer 110. Also an adhesion layer 117 like tin-lead alloy, gold or other jointing material layer can be further coated on the UBM layer 115 to enhance the adhesion of the jointing material 120. The second bonding pads 114 can be formed on the active surface 111 of the wafer 110 corresponding to the central region of each chip 110a. A dam 118 is formed on the active surface 111 to separate the first bonding pads 113 from the second bonding pads 114 so as to block, disperse, and limit the overflow of the jointing material 120. Preferably, the dam 118 surrounds the second bonding pads 114. In this embodiment, the dam 118 is a rectangular ring and may includes a space 119, which is made of a patterned photoresist layer or a dry film to form the space 119. The patterned photoresist layer can be used for forming the RDL on the substrate 110 (wafer) to save cost. The dam 118 may includes a rectilinear portion, a wavy portion or other geometry in shape.

Referring to FIG. 1 again, the jointing material 120 is disposed on the second bonding pads 114. The jointing material 120 may be made from tin-lead solder with flux. The electronic component 130 is mounted onto the active surface 111 of the wafer 110 via the jointing material 120 by a reflowing process. In this embodiment, the electronic component 130 is a SMD type passive component selected from the group consisting of a capacitor, a resistor, and an inductor. Alternatively, the electronic component 130 may be a flip chip or a CSP. The electronic component 130 has a plurality of electrodes 131 which are connected to the second bonding pads 114 via the jointing material 120. The dam 118 is utilized for blocking, dispersing and limiting the jointing material 120 which becomes in liquid phase with high mobility during reflowing. Because of separation of the dam 118, the first bonding pads 113 of the substrate 110 are not contaminated by the jointing material 120 or flux. The electronic component 130 can be mounted on the semiconductor substrate 110 without negative effect, especially in wafer level.

Figure 3A:
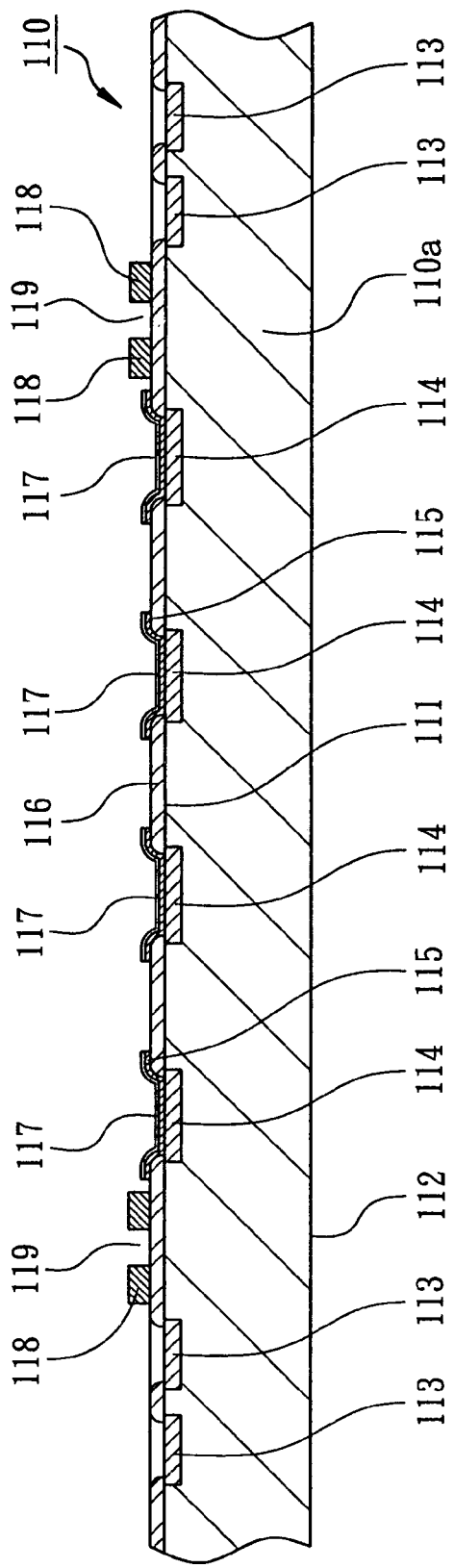
FIG. 3A to FIG. 3B are cross-sectional views of a substrate during a manufacturing process of the semiconductor device in accordance with the first embodiment of the present invention.
Figure 3B:
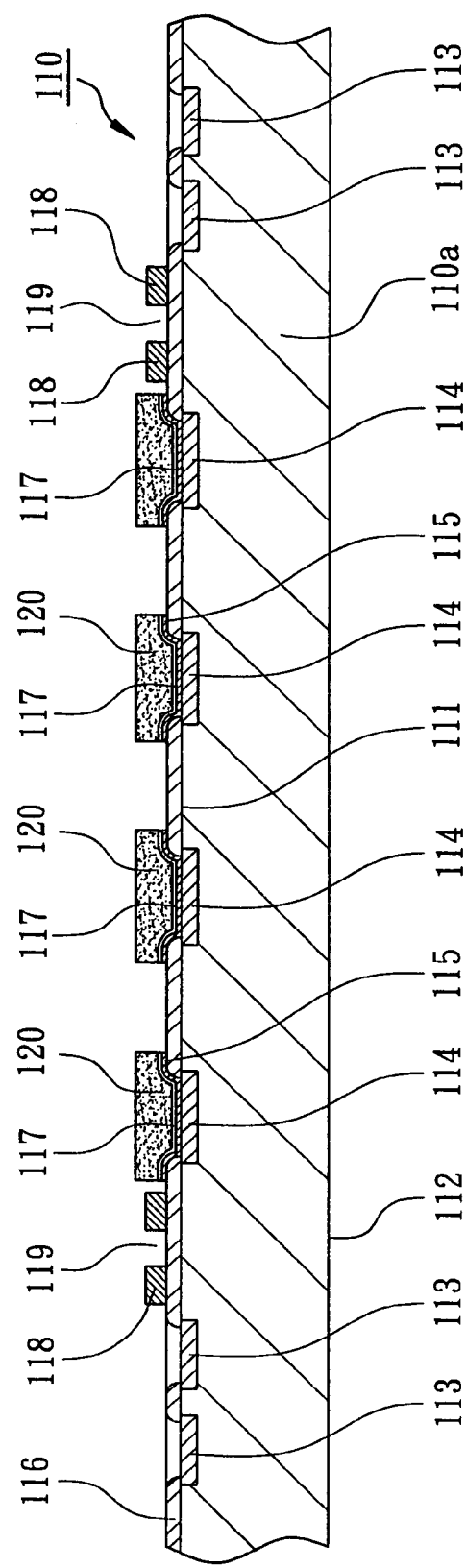

One of the methods for manufacturing the above-mentioned semiconductor device is illustrated as follows. Referring to FIG. 3A, initially a semiconductor substrate 110 in wafer level is provided including the plurality of first bonding pads 113 and second bonding pads 114 for different applications. Also a dam 118 is formed on the active surface 111 to separate the first bonding pads 113 from the second bonding pads 114. Next referring to FIG. 3B, the jointing material 120 is disposed on the second bonding pads 114 by stencil-printing or screen-printing technique. Finally referring to FIG. 1 and FIG. 2, at least an electronic component 130 is mounted on the active surface 111 of the substrate 110 after reflowing the jointing material 120. The reflowed jointing material 120 connects the electrodes 131 of the electronic component 130 to the second bonding pads 114. During reflowing, the jointing material 120 or the flux is blocked, dispersed and limited by the dam 118 without contaminating the first bonding pads 113, even the jointing material 120 has an irregular overflow over the second bonding pads 114.

Figure 4:
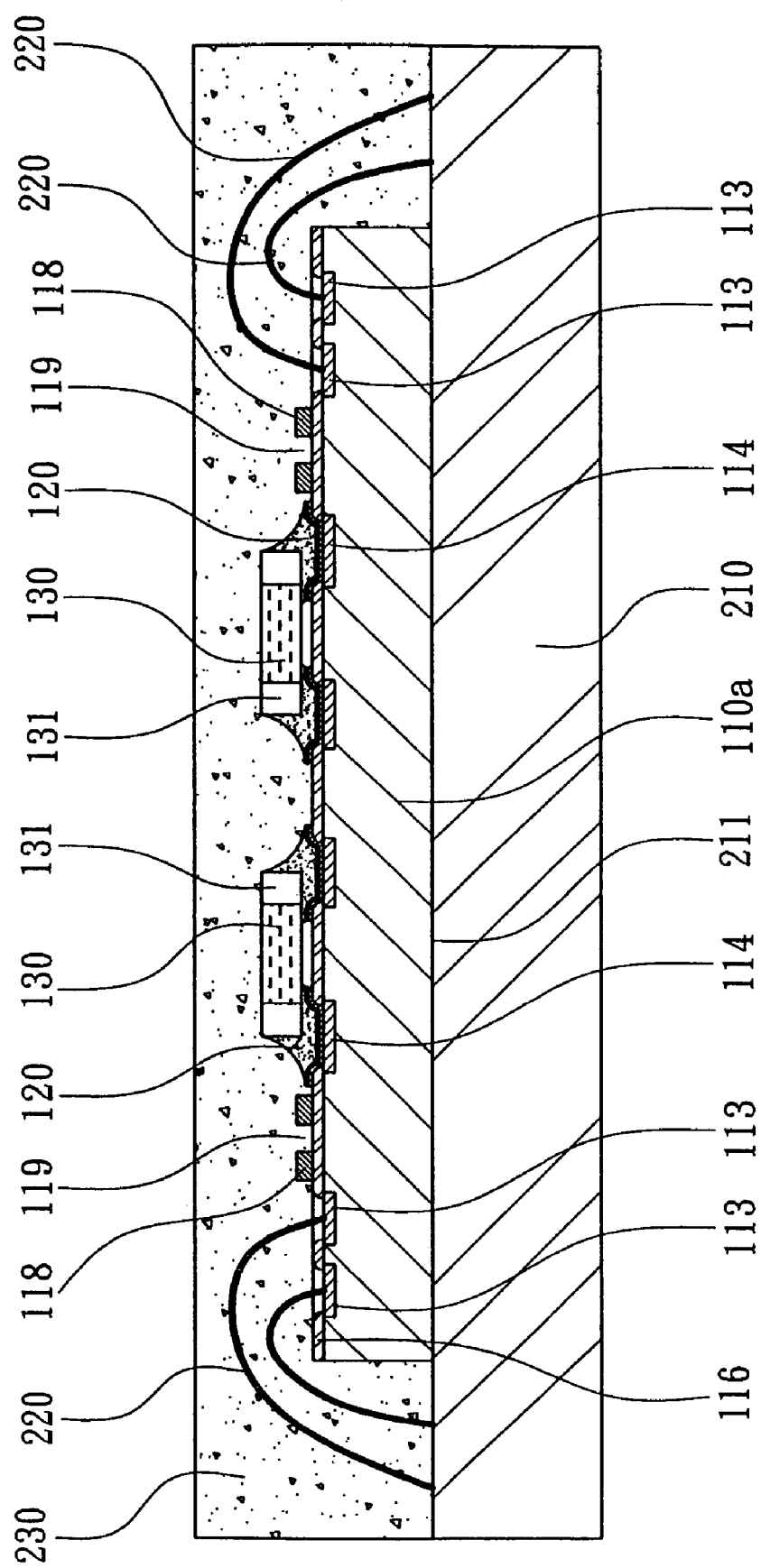
FIG. 4 is a cross-sectional view of a semiconductor package by utilizing the semiconductor device in accordance with the embodiment of the present invention.

Shown in FIG. 4 is a semiconductor package using the above-mentioned semiconductor device. The substrate 110 with electronic component 130 manufactured from the process mentioned above is singularized to be a plurality of semiconductor chips 110a respectively. Thereafter, the chip 110a is attached to the surface 211 of a carrier 210. Since the first bonding pads 113 is not contaminated by the jointing material 120 or flux from the second bonding pads 114 due to the dam 118, the electrically connecting components such as bonding wires 220 can connect the first bonding pads 113 to the carrier 210 with good electrical connection. Besides, an encapsulant 230 is further formed on the surface 211 of the carrier 210 to seal the electronic component 130 and to cover the active surface 111 of the chip 110a (substrate 110) so as to assemble a semiconductor package.

Figure 5:
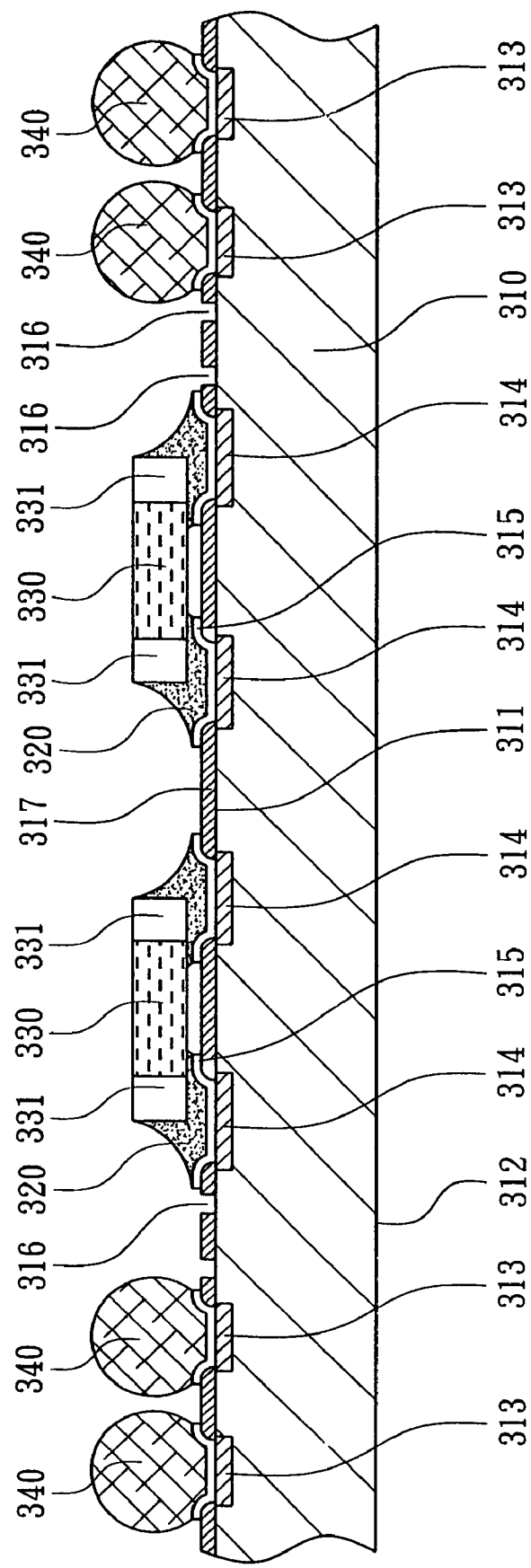
FIG. 5 is a cross-sectional view of a semiconductor device in accordance with the second embodiment of the present invention.

Another semiconductor device according to second embodiment of the present invention is shown in FIG. 5. The semiconductor device is configured for preventing contamination on bonding pads during SMT process, which includes a semiconductor substrate 310, a jointing material 320 and at least an electronic component 330. The jointing material 320 and the electronic component 330 are the same as those of the foregoing embodiment. The substrate 310 has an active surface 311, a back surface 312 opposing to the active surface 311, a plurality of first bonding pads 313 and a plurality of second bonding pads 314 both formed on the active surface 311. The substrate 310 may be a chip or a wafer-level chip scale package. In this embodiment, a redistribution layer (not showed in the drawings) is formed on the active surface 311 of the substrate 310 to electrically connect the second bonding pads 314 to the first bonding pads 313 or the circuitry of the substrate 310. The first bonding pads 313 are formed at the periphery of the active surface 311 for bonding a plurality of bumps 340. Preferably the bumps 340 are higher than the electronic component 330 in height. The second bonding pads 314 can be used as SMT pads, preferably an UBM layer 315 may be coated over the second bonding pads 314 to enhance the adhesion of the jointing material 320. Also at least a dam 316 is formed on the active surface 311 to separate the first bonding pads 313 from the second bonding pads 314. Therefore, the dam 316 can block, disperse, and limit the jointing material 320 in a central region of the active surface 311. In this embodiment, the dam 316 is made of a patterned passivation layer to form a space. The electronic component 330 is mounted on the active surface 311 of the substrate 310 by reflowing the jointing material 320 to connect the electrodes 331 with the second bonding pads 314. The dam 316 is utilized for enabling the jointing material 320 not to overflow to contaminate the first bonding pads 313 or the bumps 340 of the substrate 310.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A semiconductor device comprising:
 a) a semiconductor chip having:
  i) an active surface having a peripheral region and a central region;
  ii) a plurality of first bonding pads formed on the peripheral region of the active surface;
  iii) a plurality of second bonding pads formed on the central region of the active surface; and
  iv) a patterned passivation layer located on the active surface;
  v) at least one dam located on the patterned passivation layer between the plurality of first bonding pads and the plurality of second bonding pads, the at least one dam completely surrounding the plurality of second bonding pads;

b) a jointing material located on the second bonding pads;

c) at least one SMD type passive component mounted on the active surface of the semiconductor chip and having a plurality of electrodes connected to the second bonding pads via the jointing material;

d) a carrier connected to a back surface of the semiconductor chip;

e) a plurality of bonding wires connecting the plurality of first bonding pads to the carrier; and f) an encapsulant sealing the SMD type passive component and the bonding wires and covering the at least one dam and the active surface of the semiconductor chip.

2. The semiconductor device according to claim 1, wherein the dam is a rectangular ring.

3. The semiconductor device according to claim 1, wherein the dam includes a space.

4. The semiconductor device according to claim 3, wherein the dam is made of a patterned photoresist layer located on the patterned passivation surface to form space.

5. The semiconductor device according to claim 1, further comprising a under bump metallurgy layer located above the plurality of second bonding pads.

6. The semiconductor device according to claim 1, wherein the jointing material is tin-lead solder.

7. The semiconductor device according to claim 1, wherein the jointing material includes flux.

8. The semiconductor device according to claim 1, wherein the SMD type passive component is selected from a group consisting of a capacitor, a resistor, and an inductor.

9. A method for manufacturing a semiconductor device, which comprises the steps of:

a) providing a semiconductor chip having:
  i) an active surface having a peripheral region and a central region;
  ii) a plurality of first bonding pads formed on the peripheral region of the active surface;
  iii) a plurality of second bonding pads formed on the central region of the active surface;
  iv) a patterned passivation layer located on the active surface; and
  v) at least one dam located on the patterned passivation layer between the plurality of first bonding pads and the plurality of second bonding pads, the at least one dam completely surrounding the plurality of second bonding pads;

b) applying a jointing material on the second bonding pads;

c) connecting a plurality of electrodes of at least one SMD type passive component to the s second bonding pads located on the active surface of the semiconductor chip via the jointing material;

d) adjoining a carrier to a back surface of the semiconductor chip;

e) connecting the plurality of first bonding pads to the carrier utilizing a plurality of bonding wires; and f) sealing the SMD type passive component and the bonding wires and covering the at least one dam and the active surface of the substrate semiconductor chip utilizing an encapsulant.

10. The method according to claim 9, wherein the dam is a rectangular ring.

11. A semiconductor device comprising:

a) a semiconductor chip having:
  I) an active surface having a peripheral region and a central region;
  ii) a plurality of first bonding pads formed on the peripheral region of the active surface;
  iii) a plurality of second bonding pads formed on the central region of the active surface;
  iv) a patterned passivation layer located on the active surface and having at least one dam located between the plurality of first bonding pads and the plurality of second bonding pads and at least one space located between the at least one dam and the plurality of second bonding pads, the at least one dam completely surrounding the plurality of second bonding pads wherein the space and the dam are integrally formed by the patterned passivation layer, and the space is configured for preventing the jointing material from contaminating the first bonding pads; and b) a jointing material located on the second bonding pads, wherein the space and the dam are integrally formed by the patterned passivation layer, and the space is configured for preventing the jointing material from contaminating the first bonding pads;

c) at least one SMD type passive component mounted on the active surface of the semiconductor chip and having a plurality of electrodes connected to the second bonding pads via the jointing material;

d) a carrier connected to a back surface of the semiconductor chip;

e) a plurality of bonding wires connecting the plurality of first bonding pads to the carrier; and f) an encapsulant sealing the SMD type passive component and the bonding wires and covering the at least one dam and the active surface of the semiconductor chip.

12. The semiconductor device according to claim 11, wherein the dam is a rectangular ring.

13. The semiconductor device according to claim 11, further comprising a space located between the dam and the plurality of first bonding pads.

14. The semiconductor device according to claim 11, further comprising a under bump metallurgy layer located above the plurality of second bonding pads.

15. The semiconductor device according to claim 11, wherein the jointing material is tin-lead solder.

16. The semiconductor device according to claim 11, wherein the jointing material includes flux.

17. The semiconductor device according to claim 11, wherein the SMD type passive component is selected from a group consisting of a capacitor, a resistor, and an inductor.

* * * * *